United States Patent
Seo et al.

(10) Patent No.: US 10,468,388 B2
(45) Date of Patent: Nov. 5, 2019

(54) DISPLAY APPARATUS HAVING LED EFFECTIVELY PREVENTED FROM BEING RECOGNIZED AS POINT SOURCE OF LIGHT

(71) Applicant: SAMSUNG DISPLAY CO., LTD., Yongin-si, Gyeonggi-do (KR)

(72) Inventors: Youngseok Seo, Yongin-si (KR); Mugyeom Kim, Yongin-si (KR); Minsoo Kim, Yongin-si (KR); Junghyun Kim, Yongin-si (KR); Seunglyong Bok, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 12 days.

(21) Appl. No.: 15/355,116

(22) Filed: Nov. 18, 2016

(65) Prior Publication Data
US 2017/0263672 A1    Sep. 14, 2017

(30) Foreign Application Priority Data

Mar. 10, 2016    (KR) ................. 10-2016-0029110

(51) Int. Cl.
*H01L 25/075*    (2006.01)
*H01L 33/58*    (2010.01)
(Continued)

(52) U.S. Cl.
CPC ........ *H01L 25/0753* (2013.01); *H01L 25/167* (2013.01); *H01L 33/508* (2013.01); *H01L 33/58* (2013.01); *H01L 2933/0091* (2013.01)

(58) Field of Classification Search
CPC ......... H01L 33/38; H01L 33/54; H01L 33/60; H01L 33/44; H01L 33/58; H01L 33/32;
(Continued)

(56) References Cited

U.S. PATENT DOCUMENTS 8,613,533 B2    12/2013    Cho
8,624,268 B2    1/2014    Cho et al.
(Continued)

FOREIGN PATENT DOCUMENTS

JP    2014001273 A    1/2014
KR    1008828210000 B1    2/2009
(Continued)

OTHER PUBLICATIONS refractiveindex.info/?shelf=main&book=SiO2&page=Malitson, accessed Feb. 12, 2018.*

(Continued)

*Primary Examiner* — Mohsen Ahmadi
*Assistant Examiner* — Scott E Bauman
(74) *Attorney, Agent, or Firm* — Cantor Colburn LLP

(57) ABSTRACT

A display apparatus includes: a substrate; a light-emitting diode ("LED") disposed above the substrate; a pixel-defining layer disposed above the substrate and including a concave portion which defines a space in which the LED is disposed; a light guider disposed in the space and between the LED and a first inner side surface of the concave portion; and a light blocker disposed above the pixel-defining layer to cover a top portion of the LED. The LED is disposed a second inner side surface of the concave portion, which is opposite to the first inner side surface, and spaced apart from a center of the concave portion, and the light guider guides light emitted from the LED to a region adjacent to the second inner side surface of the concave portion.

19 Claims, 8 Drawing Sheets

(51) Int. Cl.
*H01L 25/16* (2006.01)
*H01L 33/50* (2010.01)

(58) Field of Classification Search
CPC ........... H01L 33/507; H01L 2933/0091; H01L 33/0045; H01L 33/91; H01L 27/15–27/156; H01L 33/46; H01L 33/508; H01L 25/167; H01L 25/0752; H01L 25/0753
See application file for complete search history.

(56) References Cited

U.S. PATENT DOCUMENTS

| | | | | |
|---|---|---|---|---|
| 9,880,342 | B2 * | 1/2018 | Vasylyev | ............... G02B 6/005 |
| 2009/0108283 | A1 * | 4/2009 | Kadotani | ............ G02B 6/0055 |
| | | | | 257/98 |
| 2012/0020113 | A1 * | 1/2012 | Zheng | .................. G02B 6/0021 |
| | | | | 362/612 |
| 2013/0141651 | A1 * | 6/2013 | Kuromizu | ............ G02B 6/0088 |
| | | | | 348/739 |
| 2014/0016661 | A1 * | 1/2014 | Orita | ....................... H01L 33/02 |
| | | | | 372/50.1 |
| 2014/0064904 | A1 | 3/2014 | Bibl et al. | |
| 2014/0159043 | A1 | 6/2014 | Sakariya et al. | |
| 2014/0159064 | A1 | 6/2014 | Sakariya et al. | |
| 2014/0159067 | A1 | 6/2014 | Sakariya et al. | |
| 2014/0367705 | A1 * | 12/2014 | Bibl | ........................ H01L 33/44 |
| | | | | 257/88 |
| 2014/0367711 | A1 | 12/2014 | Bibl et al. | |
| 2014/0368769 | A1 * | 12/2014 | Lee | ...................... G02B 6/0068 |
| | | | | 349/65 |
| 2015/0076528 | A1 | 3/2015 | Chan et al. | |
| 2015/0093842 | A1 | 4/2015 | Higginson et al. | |
| 2015/0166847 | A1 | 6/2015 | Morita et al. | |
| 2016/0043061 | A1 | 2/2016 | Rhee | |
| 2017/0062515 | A1 * | 3/2017 | Kim | ........................ H01L 33/06 |

FOREIGN PATENT DOCUMENTS

| | | |
|---|---|---|
| KR | 1020120011253 A | 2/2012 |
| KR | 101283282 B1 | 7/2013 |
| KR | 1020150031393 A | 3/2015 |
| KR | 1020150112620 A | 10/2015 |
| KR | 101476686 B1 | 2/2016 |

OTHER PUBLICATIONS refractiveindex.info/?shelf=organic&book=poly(methyl_methacrylate)&page=Sultanova, accessed Feb. 12, 2018.*

* cited by examiner

DISPLAY APPARATUS HAVING LED EFFECTIVELY PREVENTED FROM BEING RECOGNIZED AS POINT SOURCE OF LIGHT

This application claims priority to Korean Patent Application No. 10-2016-0029110, filed on Mar. 10, 2016, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus including a light-emitting diode ("LED").

2. Description of the Related Art

A light-emitting diode ("LED") is a device that converts an electric signal into a form of light, such as infrared light or visible light, by using characteristics of a compound semiconductor, and is widely used in home appliances, remote controllers, electronic display boards, and various automation devices. Areas of use of LEDs are gradually increasing; for example, LEDs are used in extensive fields of electronic devices from miniature hand-held electronic devices to large display apparatuses. However, a display apparatus including the LED that is a point source of light may have low display quality due to a visibility difference between a region near the LED and a region spaced apart from the LED in the same light-emitting region.

SUMMARY

One or more embodiments relate to a display apparatus with high display quality.

According to an embodiment, a display apparatus includes: a substrate; a light-emitting diode ("LED") disposed above the substrate; a pixel-defining layer disposed above the substrate and including a concave portion which defines a space in which the LED is disposed; a light guider disposed in the space and between the LED and the pixel-defining layer; and a light blocker disposed above the pixel-defining layer to cover a top surface of the LED. In such an embodiment, the LED is disposed adjacent to a second inner side surface of the concave portion, which is opposite to the first inner side surface, and spaced apart from a center of the concave portion, and the light guider guides light emitted from the LED to a region adjacent to the second inner side surface of the concave portion.

In an embodiment, the display apparatus may further include a light blocking layer disposed to cover at least a first side surface of the light-emitting diode, which is opposite to a second side surface of the light-emitting diode facing the second inner side surface of the concave portion.

In an embodiment, the light blocking layer may extend to cover the top portion of the LED.

In an embodiment, the light blocker may extend along a first direction and may be disposed above the second inner side surface of the concave portion.

In an embodiment, the display apparatus may further include a first electrode disposed above the substrate, and the LED may include a p-n diode, a first contact electrode electrically connected to the first electrode, and a second contact electrode electrically connected to the light blocker.

In an embodiment, the light blocker may extend along a second direction different from the first direction, and a voltage for driving the LED may be applied to the light blocker.

In an embodiment, a plurality of scattered particles may be distributed in the light guider.

In an embodiment, the scattered particles may be more densely distributed in a direction away from the LED.

In an embodiment, the scattered particles may include a fluorescent substance.

In an embodiment, scattered patterns may be defined on a surface of the light guider, and the scattered patterns may be defined more densely in a direction towards the light blocker.

In an embodiment, reflection patterns may be disposed in a bottom portion of the concave portion, and the reflection patterns may be disposed more densely in a direction away from the LED.

In an embodiment, the display apparatus may further include a first electrode electrically connected to the LED and disposed below the bottom portion of the concave portion, and the reflection patterns may be disposed above the first electrode.

In an embodiment, the display apparatus may further include a molding portion disposed between the LED and the light guider, where the LED may include an n-type semiconductor layer, a p-type semiconductor layer, and an intermediate layer between the n-type semiconductor layer and the p-type semiconductor layer, and the molding portion may cover at least an exposed portion of the intermediate layer.

In an embodiment, a refractive index of the molding portion may be different from a refractive index of the light guider.

In an embodiment, the LED may include a first contact electrode electrically connected to a first electrode of the display apparatus, and a second contact electrode electrically connected to a second electrode of the display apparatus, and a plurality of carbon nano-tubes may be distributed in the light guider. In such an embodiment, a density of the carbon nano-tubes in a region between the first contact electrode and the first electrode or a region between the second contact electrode and the second electrode may be higher than a density of the carbon-nano-tubes in remaining regions of the light guider.

In an embodiment, a reflection layer may be disposed to cover an inner side surface of the concave portion.

In an embodiment, the concave portion may include a first concave portion and a second concave portion, which are adjacent to each other, the LED may include a first LED and a second LED, which are disposed in the first concave portion and the second concave portion, respectively, and the light blocker may extend to cover a top portion of the first LED and a top portion of the second LED.

In an embodiment, the first LED and the second LED may be disposed adjacent to a portion of the pixel-defining layer between the first concave portion and the second concave portion.

In an embodiment, the light blocker may be disposed to cover the top portion of the first LED, the top portion of the second LED, and the portion of the pixel-defining layer between the first concave portion and the second concave portion.

According to an embodiment, a display apparatus includes: a substrate; an LED disposed above the substrate; a pixel-defining layer disposed above the substrate and including a concave portion which defines a space for the LED; and a light blocker disposed to cover a top portion of the LED, where the LED is spaced apart from a center of the concave portion and disposed adjacent to an inner surface of the concave portion which defines the space, and the LED includes: a first side surface, which faces the inner surface of the pixel-defining layer which defines the concave portion; and a second side surface, which is opposite to the first side surface, wherein a light blocking layer is disposed to cover at least the first side surface of the light-emitting diode.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
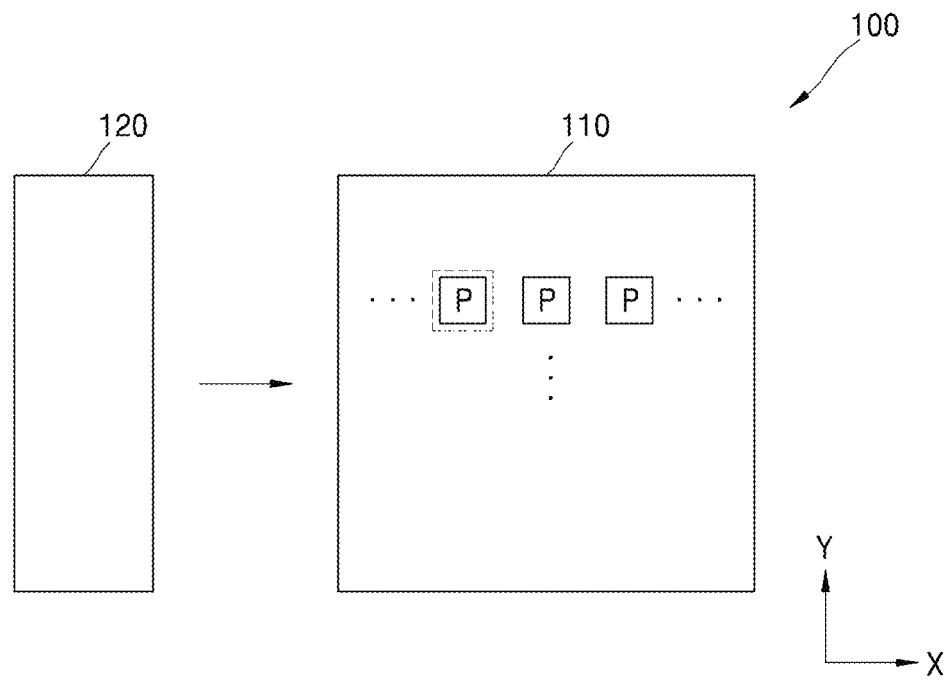
FIG. 1 is a plan view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, one or more embodiments will be described in detail with reference to the accompanying drawings. Those components that are the same or are in correspondence are rendered the same reference numeral regardless of the figure number, and redundant detailed descriptions thereof may be omitted.

Figure 2:
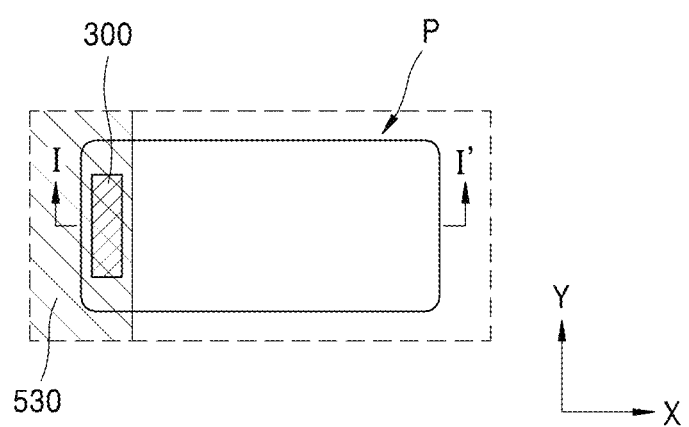
FIG. 2 is a plan view schematically illustrating an embodiment of a pixel in the display apparatus of FIG. 1.
Figure 3:
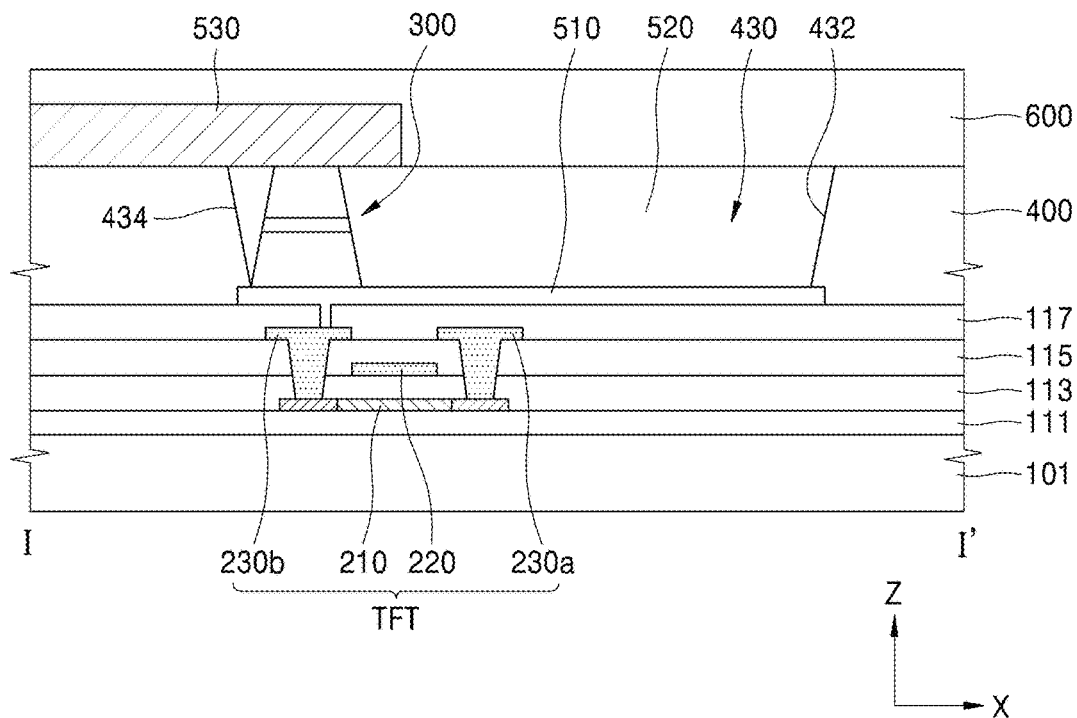
FIG. 3 is a cross-sectional view taken along line I-I' of FIG. 2, according to an embodiment.
Figure 4:
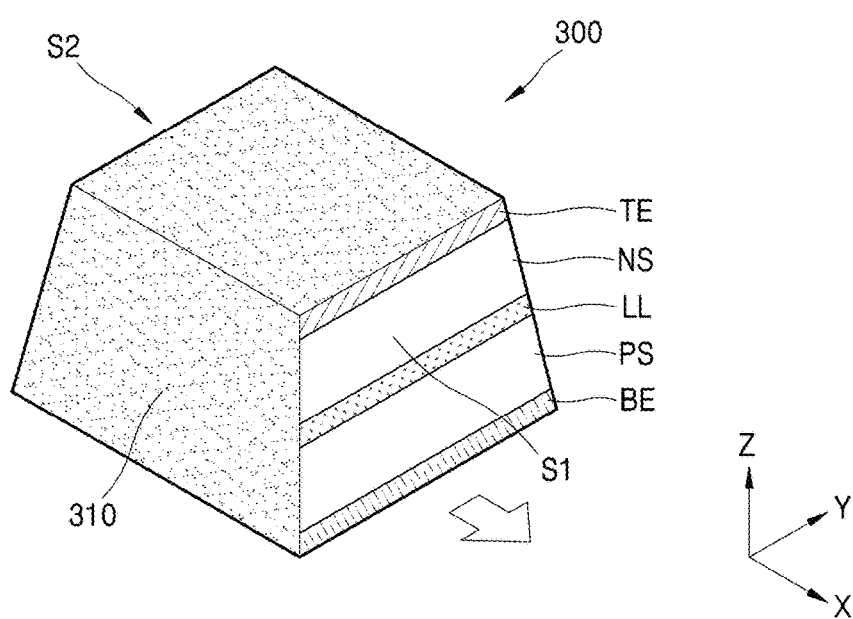
FIG. 4 is a perspective view schematically illustrating an exemplary embodiment of a light-emitting diode ("LED") included in the display apparatus of FIG. 1.

FIG. 1 is a plan view schematically illustrating a display apparatus 100 according to an embodiment, FIG. 2 is a plan view schematically illustrating an exemplary embodiment of a pixel P in the display apparatus 100 of FIG. 1, FIG. 3 is a cross-sectional view taken along line I-I' of FIG. 2, and FIG. 4 is a perspective view schematically illustrating an exemplary embodiment of a light-emitting diode ("LED") 300 included in the display apparatus 100 of FIG. 1.

Referring to FIG. 1, an embodiment of the display apparatus 100 includes a display 110 and a driver 120. The display 110 may include a plurality of pixels P arranged on a substrate 101. The driver 120 may include a scan driver for applying a scan signal to a scan line connected to a pixel P, and a data driver for applying a data signal to a data line connected to the pixel P.

The driver 120 may be disposed in a non-display area of the substrate 101 around the display 110 where the pixels P are arranged. The driver 120 may be in a form of an integrated circuit ("IC") chip to be directly mounted above the substrate 101 where the display 110 is arranged, mounted above a flexible printed circuit film, adhered on the substrate 101 in a form of a tape carrier package ("TCP"), or directly disposed on the substrate 101.

Referring to FIGS. 2 and 3, each pixel P may include the LED 300 and a pixel circuit connected to the LED 300. The pixel circuit may include a thin-film transistor TFT and a capacitor. The pixel circuit is connected to a corresponding scan line and a corresponding data line that cross each other.

The thin-film transistor TFT and the LED 300 may be disposed above the substrate 101. According to an embodiment, a buffer layer 111 may be further disposed above the substrate 101.

The substrate 101 may include or be formed of at least one of various materials. In one embodiment, for example, the substrate 101 may include or be formed of a transparent glass material including silicon oxide ($SiO_2$) as a main element. However, a material of the substrate 101 is not limited thereto, and alternatively, the substrate 101 may include or be formed of a transparent plastic material and may be flexible. Here, the plastic material may be an insulating organic material selected from polyethersulphone ("PES"), polyacrylate ("PAR"), polyetherimide ("PEI"), polyethyelenen napthalate ("PEN"), polyethyeleneterephtalate ("PET"), polyphenylene sulfide ("PPS"), polyallylate, polyimide, polycarbonate ("PC"), cellulose triacetate ("TAC"), and cellulose acetate propionate ("CAP").

In an embodiment, where the display apparatus 100 is a bottom emission type in which an image is displayed or output towards the substrate 101, the substrate 101 includes or is formed of a transparent material. In an alternative embodiment, where the display apparatus 100 is a top emission type in which an image is displayed or output in a direction opposite to the substrate 101, the substrate 101 may not include or be formed of a transparent material. In such an embodiment, the substrate 101 may include or be formed of a metal.

In an embodiment, where the substrate 101 includes or is formed of a metal, the substrate 101 may include at least one selected from iron, chromium, manganese, nickel, titanium, molybdenum, stainless steel ("SUS"), invar alloy, inconel alloy, and kovar alloy, but is not limited thereto.

The buffer layer 111 may provide a flat surface on a top of the substrate 101, and effectively prevent impurities or moisture from penetrating through the substrate 101. In one embodiment, for example, the buffer layer 111 may include an inorganic material, such as silicon oxide, silicon nitride, silicon oxynitride, aluminum oxide, aluminum nitride, titanium oxide, or titanium nitride, or an organic material, such as polyimide, polyester, or acryl, and may have a stacked structure of layers, each including at least one of the above materials.

The thin-film transistor TFT may include an active layer 210, a gate electrode 220, a source electrode 230a, and a drain electrode 230b.

Hereinafter, for convenience of description, an embodiment where the thin-film transistor TFT is a top gate type in which the active layer 210, the gate electrode 220, the source electrode 230a and the drain electrode 230b are sequentially stacked on each other, will be described in detail. However, an embodiment is not limited thereto, and the thin-film transistor TFT may be any type, such as a bottom gate type.

In an embodiment, the active layer 210 may include a semiconductor material, such as amorphous silicon or polycrystalline silicon. However, an embodiment is not limited thereto, and the active layer 210 may include any one of various materials. According to an embodiment, the active layer 210 may include an organic semiconductor material.

According to an alternative embodiment, the active layer 210 may include an oxide semiconductor material. In one embodiment, for example, the active layer 210 may include an oxide of a material selected from 12, 13, and 14-group metal elements, such as zinc (Zn), indium (In), gallium (Ga), tin (Sn), cadmium (Cd), and germanium (Ge), or a combination thereof.

A gate insulating layer 113 is disposed above the active layer 210. The gate insulating layer 113 insulates the active layer 210 and the gate electrode 220 from each other. The gate insulating layer 113 may be a single layer or multilayer including a film including or formed of an inorganic material, such as silicon oxide and/or silicon nitride.

The gate electrode 220 is disposed above the gate insulating layer 113. The gate electrode 220 may be connected to a gate line (not shown) that applies an on/off signal to the thin-film transistor TFT.

The gate electrode 220 may include or be formed of a low resistance metal material. The gate electrode 220 may be a single layer or multilayer including or formed of at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating layer 115 is disposed above the gate electrode 220. The interlayer insulating layer 115 insulates the source and drain electrodes 230a and 230b from the gate electrode 220. The interlayer insulating layer 115 may be a single layer or multilayer including a film including or formed of an inorganic material. In one embodiment, the inorganic material may be metal oxide or metal nitride. In one embodiment, for example, the inorganic material may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZrO_2$).

The source electrode 230a and the drain electrode 230b are disposed above the interlayer insulating layer 115. The source electrode 230a and the drain electrode 230b may each be a single layer or multilayer including or formed of at least one material selected from Al, Pt, Pd, Ag, Mg, Au, Ni, Nd, Ir, Cr, Li, Ca, Mo, Ti, W, and Cu. The source and drain electrodes 230a and 230b are electrically connected to a source region and a drain region of the active layer 210 respectively, through contact holes defined through the gate insulating layer 113 and the interlayer insulating layer 115.

A planarization layer 117 is disposed above the thin-film transistor TFT. The planarization layer 117 may cover the thin-film transistor TFT to remove a stepped portion formed due to the thin-film transistor TFT and flattens a top surface of the thin-film transistor TFT.

The planarization layer 117 may be a single layer or multilayer including a film including or formed of an organic material. In one embodiment, for example, the organic material may include a general commercial polymer, such as polymethylmethacrylate ("PMMA") or polystyrene ("PS"), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, and a combination or blend thereof. In an embodiment, the planarization layer 117 may have a complex stacked structure including an inorganic insulating layer and an organic insulating layer.

A first electrode 510 is disposed above the planarization layer 117. The first electrode 510 may be electrically connected to the thin-film transistor TFT. In one embodiment, for example, the first electrode 510 may be electrically connected to the source electrode 230a or the drain electrode 230b through a contact hole defined in the planarization layer 117. The first electrode 510 may have any one of various shapes, and for example, may be patterned in an island shape and disposed at a bottom surface of a concave portion 430.

The first electrode 510 may include a reflective layer including or formed of Ag, Mg, Al, Pt, Pd, Au, Ni, Nd, Ir, Cr, or a combination or compound thereof, and a transparent or semi-transparent electrode layer disposed above the reflective layer. The transparent or semi-transparent electrode layer may include or be formed of at least one selected from indium tin oxide ("ITO"), indium zinc oxide ("IZO"), zinc oxide ("ZnO"), indium oxide ($In_2O_3$), indium gallium oxide ("IGO"), and aluminum zinc oxide ("AZO").

A pixel-defining layer 400 for defining an emission region may be disposed above the planarization layer 117. The pixel-defining layer 400 may include the concave portion 430 in which the LED 300 is accommodated. A height of the pixel-defining layer 400 may be determined based on a height and a viewing angle of the LED 300. A size (e.g., a width) of the concave portion 430 may be determined based on resolution, pixel density, etc. of the display apparatus 100. In an embodiment, as shown in FIG. 2, the concave portion 430 may have a quadrangular shape, but an embodiment is not limited thereto. Alternatively, the concave portion 430 may have any one of various shapes, such as a polygonal shape, a circular shape, a conical shape, and a triangular shape.

The pixel-defining layer 400 may include a material that absorbs at least some of light, a light reflecting material, or a light scattering material. The pixel-defining layer 400 may include a semi-transparent or opaque insulating material with respect to visible light (for example, light in a wavelength range from 380 nm to 750 nm). In one embodiment, for example, the pixel-defining layer 400 may include or be formed of thermoplastic resin, such as PC, PET, PES, polyvinyl butyral, polyphenylene ether, polyamide, polyetherimide, norbornene system resin, methacryl resin, or cyclic polyolefin, thermosetting resin, such as epoxy resin, phenol resin, urethane resin, acryl resin, vinyl ester resin, imide-based resin, urethane-based resin, urea resin, or melamine resin, or an organic insulating material, such as polystyrene, or polyacrylonitrile, but an embodiment is not limited thereto.

In an alternative embodiment, the pixel-defining layer 400 may include or be formed of an inorganic insulating material, such as an organic oxide or organic nitride, for example, $SiO_x$, $SiN_x$, $SiN_xO_y$, $AlO_x$, $TiO_x$, $TaO_x$, or $ZnO_x$, but an embodiment is not limited thereto.

According to an embodiment, the pixel-defining layer 400 may include or be formed of an opaque material, such as an insulating black matrix material. In such an embodiment, the insulating black matrix material may include at least one of resin or paste including organic resin, glass paste, and black pigments, metal particles of, for example, Ni, Al, Mo, and alloys thereof, metal oxide particles (for example, Cr oxide particles), and metal nitride particles (for example, Cr nitride particles).

According to an embodiment, a reflective layer (not shown) may be disposed on an inner side surface of the pixel-defining layer 400 surrounding and defining the concave portion 430. The reflective layer may be, for example, a distributed Bragg reflector ("DBR") having high reflectivity or a mirror reflector including or formed of a metal. Accordingly, light emitted from the LED 300 may be reflected at the inner side surface of the pixel-defining layer 400.

The LED 300 is disposed in the concave portion 430 defined by the a first inner surface side 432 and a second inner surface side 434 opposing the first inner surface side 432, as shown in FIG. 3. In an embodiment, as shown in FIG. 4, the LED 300 may include a p-n diode, a first contact electrode BE and a second contact electrode TE.

The p-n diode may include a first semiconductor layer PS, a second semiconductor layer NS, and an intermediate layer LL between the first and second semiconductor layers PS and NS.

The first semiconductor layer PS may include, for example, a p-type semiconductor layer. The p-type semiconductor layer may include at least one selected from semiconductor materials having an empirical formula of $In_xAl_yGa_{1-x-y}N$ ($0 \leq x \leq 1$, $0 \leq y \leq 1$, and $0 \leq x+y \leq 1$), such as GaN, AlN, AlGaN, InGaN, InN, InAlGaN, and AlInN, and a p-type dopant, such as Mg, Zn, Ca, Sr, or Ba may be doped. The first contact electrode BE may be below the first semiconductor layer PS.

The second semiconductor layer NS may include, for example, an n-type semiconductor layer. The n-type semiconductor layer may include at least one selected from semiconductor materials having an empirical formula of $In_xAl_yGa_{1-x-y}N$ ($0 \leq x \leq 1$, $0 \leq y \leq 1$, and $0 \leq x+y \leq 1$), such as GaN, AlN, AlGaN, InGaN, InN, InAlGaN, and AlInN, and an n-type dopant, such as Si, Ge, or Sn may be doped. The second contact electrode TE may be formed on the second semiconductor layer NS.

However, an embodiment is not limited thereto, and alternatively, the first semiconductor layer PS may include an n-type semiconductor layer and the second semiconductor layer NS may include a p-type semiconductor layer.

The intermediate layer LL is a region where holes and electrons are recombined, and is transited to a low energy level as the holes and electrons are recombined and may generate light having a wavelength corresponding to the low energy level. The intermediate layer LL may include, for example, a semiconductor material having an empirical formula of $In_xAl_yGa_{1-x-y}N$ ($0 \leq x \leq 1$, and $0 \leq x+y \leq 1$), and may have a single quantum well structure or a multi quantum well ("MQW") structure. Alternatively, the intermediate layer LL may have a quantum wire structure or a quantum dot structure.

The first contact electrode BE and/or the second contact electrode TE may have a layer structure, and may include or be formed of any one of various conductive materials, such as metals, conductive oxides, and conductive polymers.

The LED 300 may be spaced apart from a center of the concave portion 430 and disposed adjacent to the second inner side surface 434 of the pixel-defining layer 400 that defines the concave portion, and a top surface of the LED 300 may be covered by a light blocker 530. In an embodiment, the LED 300 may have a reversed tapered shape to contact the adjacent second inner side surface 434 of the pixel-defining layer 400, as shown in FIG. 3.

The light blocker 530 may have a larger area than the LED 300 to entirely cover the LED 300. The light blocker 530 may extend along a first direction (−X direction) and may be disposed above the pixel-defining layer 400 adjacent to the LED 300. Accordingly, the LED 300 may be effectively prevented from being recognized as a point source of light.

In one embodiment, for example, the light blocker 530 may be black matrix. In one alternative embodiment, for example, the light blocker 530 may be a second electrode that is electrically connected to the second contact electrode TE and applies a voltage for driving the LED 300.

In an embodiment, where the second electrode is the light blocker 530, the light blocker 530 may include or be formed of a metal material that absorbs or reflects light. In one embodiment, for example, the light blocker 530 may include or be formed of Ag, Mg, Al, Pt, Pd, Au, Ni, Nd, Ir, Cr, or a compound thereof. In an embodiment, the light blocker 530 may lengthily extend along a second direction (Y direction) different from the first direction (−X direction) to be connected to a voltage line for supplying common power.

In one embodiment, for example, the light blocker 530 may include the second electrode for applying a voltage for driving the LED 300 and black matrix provided above the second electrode.

A space between the LED 300 and the pixel-defining layer 400 may be filled by a light guider 520. The light guider 520 may include or be formed of, for example, an organic insulating material. The light guider 520 may have a predetermined height such that the light guider 520 does not cover a top portion of the LED 300, for example, the second contact electrode TE, thus exposing the second contact electrode TE, and the light blocker 530 electrically connected to the second contact electrode TE may be disposed above the light guider 520.

The light guider 520 may guide light emitted from the LED 300 to a region opposite to a region where the LED 300 is located based on a center of the concave portion 430, e.g., from a left side to a right side of the concave portion 430 shown in FIG. 3. Accordingly, a refractive index of the light guider 520 may be higher than a refractive index of a material of a protection layer 600, such as a lithium fluoride (LiF), where the protection layer 600 may be disposed to contact the light guider 520 above the light guider 520. Accordingly, light emitted from the LED 300 may be totally reflected at an interface of the light guider 520 and the protection layer 600, and accordingly, the light emitted from the LED 300 may be transmitted to a region of the light guider 520 spaced apart from the LED 300. Thus, a light concentration phenomenon, in which a region where the LED 300 is located is brighter, is effectively prevented and the pixel P may emit uniform light in an emission region, and accordingly, display quality of the display apparatus 100 may increase.

In an embodiment, the LED 300 may have a linear wide wall or a side wall that is tapered from top to bottom or from bottom to top. In such an embodiment, the LED 300 includes a first side surface S1 facing the center of the concave portion 430 and a second side surface, which is opposite to the first side surface S1. In such an embodiment, a light blocking layer 310 is provided at or on the second side surface S2 of the LED 300. Accordingly, light emitted from the LED 300 is prevented from being emitted through the second side surface S2, thereby effectively preventing a phenomenon, such as light escape.

The light blocking layer 310 may include or be formed of an insulating material to prevent a short-circuit between the first and second semiconductor layers PS and NS of the LED 300, and may be disposed on other side surfaces of the LED 300 that connects the first and second side surfaces S1 and S2 such that light emitted from the LED 300 is concentrated through the first side surface S1.

In an embodiment, the light blocking layer 310 may be disposed on a top portion of the LED 300, e.g., a top surface of the LED 300 or a top surface of the second semiconductor layer NS of the LED 300, to effectively prevent a location of the LED 300 from being externally recognized. In such an embodiment, the second contact electrode TE may be electrically connected to the second semiconductor layer NS through a contact hole, or the like.

In an embodiment, an area of the first side surface S1 may be larger than those of the side surfaces connecting the first and second side surfaces S1 and S2. In such an embodiment, an amount of light emitted from the first side surface S1 may increase, and accordingly, the light may be effectively transmitted to a center direction (X direction) of the concave portion 430.

In an embodiment, as shown in FIGS. 1 through 4, the LED 300 may be a vertical type in which the first contact electrode BE and the second contact electrode TE are disposed opposite to each other, but an embodiment is not limited thereto. Alternatively, the LED 300 may be a horizontal or flip type light-emitting device in which the first and second contact electrodes BE and TE face a same direction. In such an embodiment, a location of the second electrode electrically connected to the first electrode 510 and the second contact electrode TE may correspond to a location of the first and second contact electrodes BE and TE, and the light blocker 530 may include or be formed of black matrix or the like.

FIGS. 5 through 10 are cross-sectional views of alternative embodiments of a display apparatus corresponding to FIG. 3.

Figure 5:
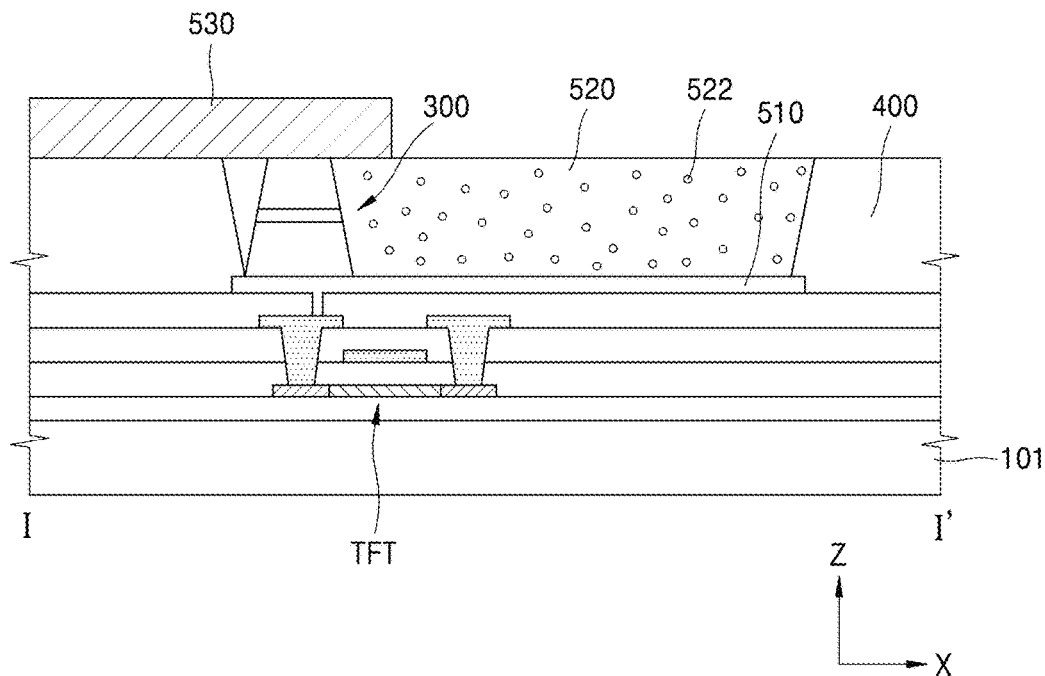
FIGS. 5 through 10 are cross-sectional views of alternative embodiments of a display apparatus corresponding to FIG. 3.

Referring to FIG. 5, in an alternative embodiment, the thin-film transistor TFT, the LED 300 electrically connected to the thin-film transistor TFT and the pixel-defining layer 400 including a concave portion in which the LED 300 is accommodated may be disposed or provided above the substrate 101. In such an embodiment, the substrate 101, the thin-film transistor TFT, the LED 300 and the pixel-defining layer 400 are substantially the same as those described above with reference to FIGS. 1 through 4, and any repetitive detailed description thereof will hereinafter be omitted.

In such an embodiment, as shown in FIG. 5, the LED 300 is electrically connected to the first electrode 510 and the light blocker 530, which are disposed opposite to each other based on, or with respect to, the LED 300 interposed therebetween, but an embodiment is not limited thereto. Alternatively, the LED 300 may be electrically connected to the first electrode 510 and a second electrode (not shown), which are disposed to face a same side based on the LED 300. In such an embodiment, the light blocker 530 covering the LED 300 may include or be formed of black matrix or the like.

The light guider 520 is disposed in, or filled inside, the concave portion to transmit light emitted from the LED 300 provided adjacent to the pixel-defining layer 400 to a region spaced apart from the LED 300.

In such an embodiment, scattered particles 522 may be distributed or dispersed inside the light guider 520. The scattered particles 522 may include or be formed of $TiO_2$ or $SiO_2$, and may scatter and diffuse-reflect light emitted from the LED 300 such that the light is effectively externally emitted.

In such an embodiment, the scattered particles 522 may be fluorescent substances. The fluorescent substance may be at least one of a blue fluorescent substance, a blue-green fluorescent substance, a green fluorescent substance, a yellowish green fluorescent substance, a yellow fluorescent substance, a yellowish red fluorescent substance, an orange fluorescent substance, and a red fluorescent substance, may be determined based on a wavelength of light emitted from the LED 300. The scattered particle 522 that is a fluorescent substance may be excited by light having a first color emitted from the LED 300 to generate light having a second color different from the first color.

In one embodiment, for example, where the LED 300 is a blue light emitting diode and the scattered particle 522 is a yellow fluorescent substance, the yellow fluorescent substance may be excited by blue light to emit yellow light, and as the blue light and the yellow light are mixed, white light may be generated. In one embodiment, for example, where the LED 300 is a green light emitting diode, the scattered particle 522 may be a magenta fluorescent substance or a mixture of a blue fluorescent substance and a red fluorescent substance, and when the LED 300 is a red light emitting diode, the scattered particle 522 may be a cyan fluorescent substance or a mixture of a blue fluorescent substance and a green fluorescent substance.

Such a fluorescent substance may be a yttrium aluminium garnet ("YAG")-based, terbium aluminum garnet ("TAG")-based, sulfide-based, silicate-based, alluminate-based, nitride-based, carbide-based, nitridosilicate-based, borate-based, fluoride-based, or phosphate-based fluorescent substance.

Figure 6:
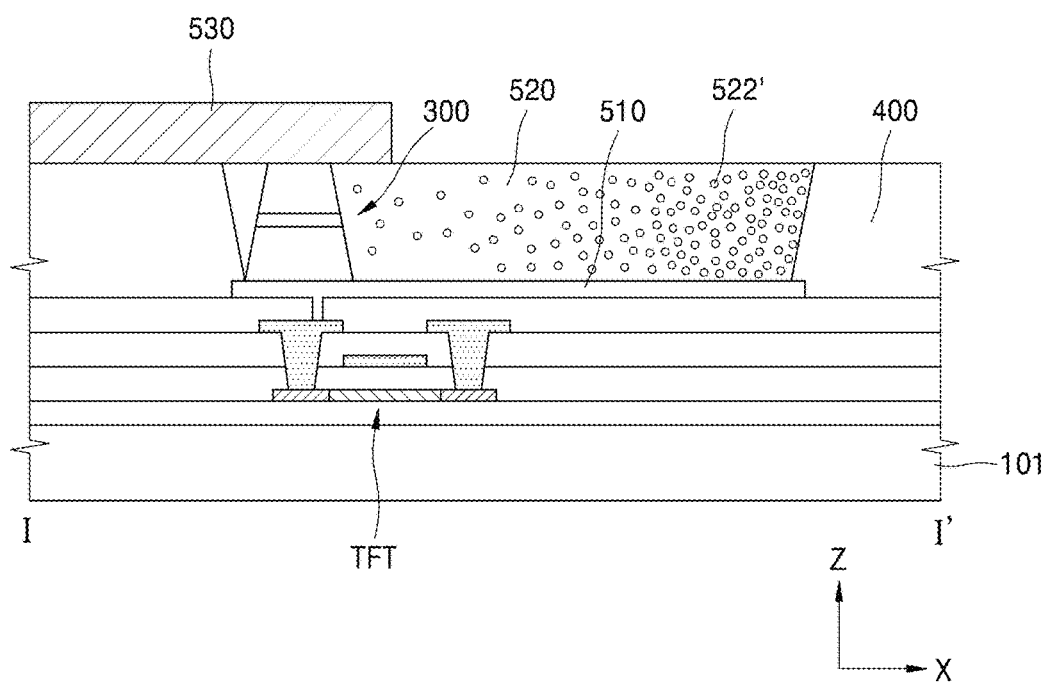

In another alternative embodiment, referring to FIG. 6, the thin-film transistor TFT, the LED 300 electrically connected to the thin-film transistor TFT, and the pixel-defining layer 400 including a concave portion in which the LED 300 is accommodated may be disposed above the substrate 101. In such an embodiment, the substrate 101, the thin-film transistor TFT, the LED 300 and the pixel-defining layer 400 are substantially the same as those described above with reference to FIGS. 1 through 4, and any repetitive detailed description thereof will be omitted.

In such an embodiment, as shown in FIG. 6, the LED 300 is electrically connected to the first electrode 510 and the light blocker 530, which are disposed opposite to each other based on the LED 300, but an embodiment is not limited thereto. Alternatively, the LED 300 may be connected to the first electrode 510 and a second electrode (not shown), which are disposed to face a same side based on the LED 300. In such an embodiment, the light blocker 530 covering the LED 300 may include or be formed of black matrix or the like.

In such an embodiment, scattered particles 522' may be dispersed or distributed in the light guider 520 that is disposed or filled inside the concave portion, and the scattered particles 522' may be fluorescent substances. In such an embodiment, the scattered particles 522' may be more densely distributed in a direction, e.g., as moving, away from the LED 300. Accordingly, light may be induced to be reflected and scattered more in a region farther from the LED 300, and thus luminance reduction in a region spaced apart from the LED 300 may be compensated.

Figure 7:
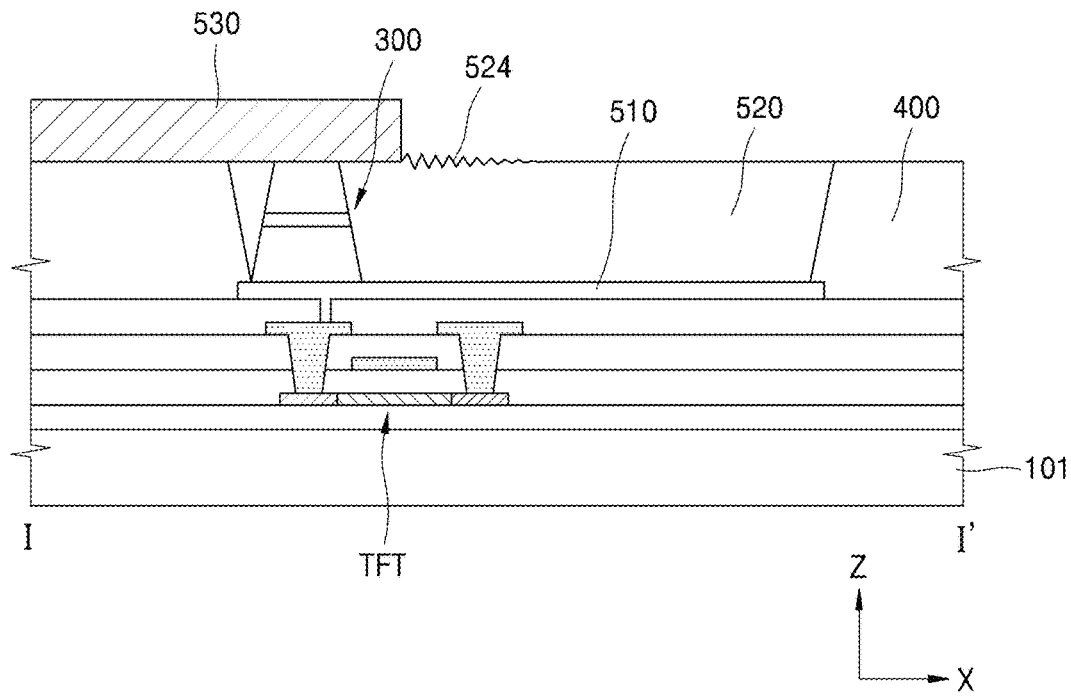

In another alternative embodiment, referring to FIG. 7, the thin-film transistor TFT, the LED 300 electrically connected to the thin-film transistor TFT, and the pixel-defining layer 400 including a concave portion in which the LED 300 is accommodated may be disposed above the substrate 101. In such an embodiment, the substrate 101, the thin-film transistor TFT, the LED 300, and the pixel-defining layer 400 are substantially the same as those described above with reference to FIGS. 1 through 4, and any repetitive detailed description thereof will be omitted.

In such an embodiment, as shown in FIG. 7, the LED 300 is electrically connected to the first electrode 510 and the light blocker 530, which are disposed opposite to each other based on the LED 300, but an embodiment is not limited thereto. Alternatively, the LED 300 may be connected to the first electrode 510 and a second electrode (not shown), which are disposed to face a same side based on the LED 300. In such an embodiment, the light blocker 530 covering the LED 300 may include or be formed of black matrix or the like.

The light guider 520 may be dispose or filled in the concave portion to transmit light emitted from the LED 300 disposed adjacent to the pixel-defining layer 400 to a region spaced apart from the LED 300.

In such an embodiment, scattered patterns 524 may be defined or formed on a surface of the light guider 520. The scattered patterns 524 may have at least one of various shapes, for example, irregular uneven shapes, prism patterns, convex shapes, and concave shapes. The scattered patterns 524 may be more densely defined in a direction towards the light blocker 530. In such an embodiment, light is scattered more by the scattered patterns 524 in a region closer to the LED 300, and is diffused wide to be emitted to outside of the light guider 520. Accordingly, a light concentration phenomenon in which a region where the LED 300 is located looks brighter is effectively prevented, and display quality of the display apparatus 100 of FIG. 1 may increase.

Figure 8:
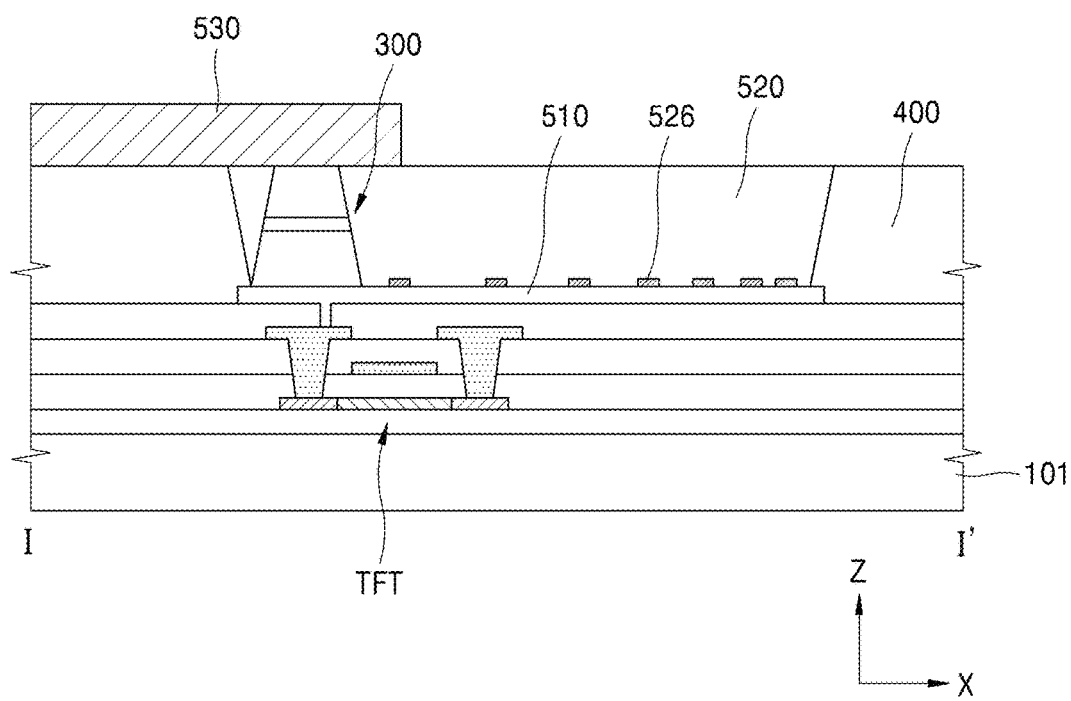

In another alternative embodiment, referring to FIG. 8, the thin-film transistor TFT, the LED 300 electrically connected to the thin-film transistor TFT, and the pixel-defining layer 400 including a concave portion in which the LED 300 is accommodated may be disposed above the substrate 101. The LED 300 may be electrically connected to the first electrode 510 and the light blocker 530, which are disposed opposite to the LED 300. In such an embodiment, the substrate 101, the thin-film transistor TFT, the LED 300 and the pixel-defining layer 400 are substantially the same as those described above with reference to FIGS. 1 through 4, and any repetitive detailed description thereof will be omitted.

In such an embodiment, the light guider 520 is disposed or filled inside the concave portion to transmit light emitted from the LED 300 disposed adjacent to the pixel-defining layer 400 to a region spaced apart from the LED 300. In such an embodiment, reflection patterns 526 may be defined or formed on a bottom surface of the concave portion. The reflection patterns 526 may have at least one of various shapes, such as dot patterns, stripe patterns, and irregular patterns. The reflection patterns 526 may increase light extracting efficiency by reflecting light emitted from the LED 300.

In such an embodiment, the reflection patterns 526 may be defined more densely in a direction away from the LED 300. Accordingly, light extraction in a position farther from the LED 300 may increase, thereby compensating luminance reduction in a region spaced apart from the LED 300, and light may be uniformly emitted from an emission region of the pixel P of FIG. 1.

The reflection patterns 526 may be disposed above the first electrode 510. In such an embodiment, the reflection patterns 526 may include or be formed of the same material as the first electrode 510. However, an embodiment is not limited thereto, and the reflection patterns 526 may include or be formed of a material different from the first electrode 510.

In such an embodiment, as shown in FIG. 8, the LED 300 is electrically connected to the first electrode 510 and the light blocker 530, which are disposed opposite to each other based on the LED 300, but an embodiment is not limited thereto. Alternatively, the LED 300 may be connected to the first electrode 510 and a second electrode (not shown), which are disposed to face a same side based on the LED 300. In such an embodiment, the light blocker 530 covering the LED 300 may include or be formed of black matrix or the like, the first electrode 510 and the second electrode may be disposed to cover only a part of a bottom surface of the concave portion, and the reflection patterns 526 may be disposed on the bottom surface of the concave portion while being spaced apart from the first electrode 510 and the second electrode.

Figure 9:
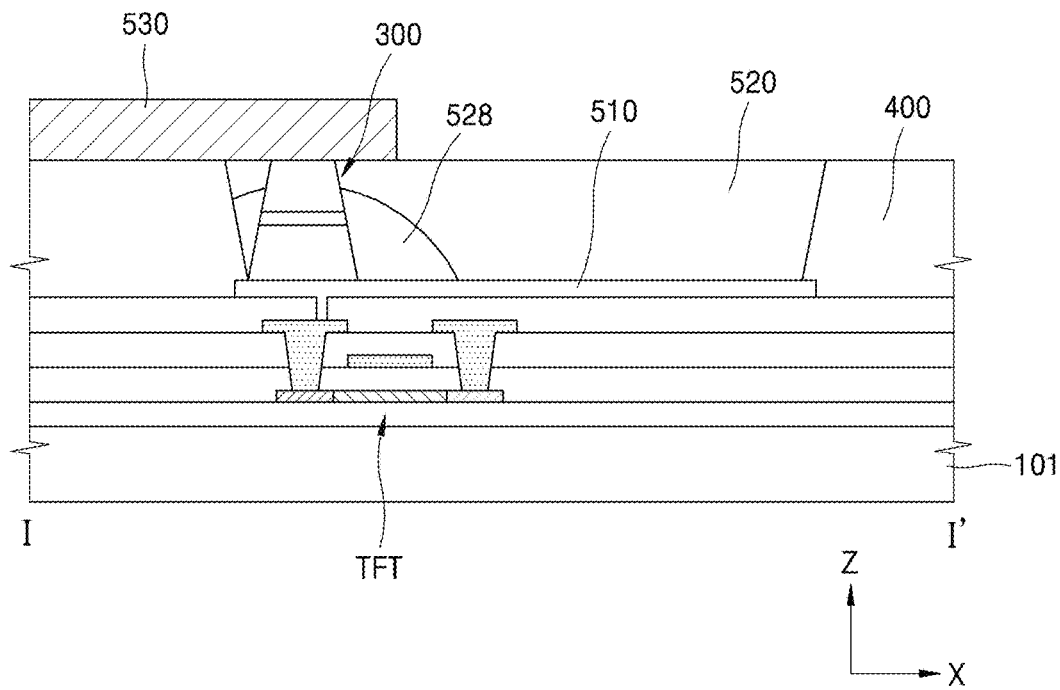

In another alternative embodiment, referring to FIG. 9, the thin-film transistor TFT, the LED 300 electrically connected to the thin-film transistor TFT, and the pixel-defining layer 400 including a concave portion in which the LED 300 is accommodated may be disposed above the substrate 101. In such an embodiment, the substrate 101, the thin-film transistor TFT, the LED 300, and the pixel-defining layer 400 are substantially the same as those described above with reference to FIGS. 1 through 4, and any repetitive detailed description thereof will be omitted.

In such an embodiment, as shown in FIG. 9, the LED 300 is electrically connected to the first electrode 510 and the light blocker 530, which are disposed opposite to each other based on the LED 300, but an embodiment is not limited thereto. Alternatively, the LED 300 may be connected to the first electrode 510 and a second electrode (not shown), which are disposed to face a same side based on the LED 300. In such an embodiment, the light blocker 530 covering the LED 300 may include or be formed of black matrix or the like.

In such an embodiment, the light guider 520 may be filled in the concave portion to transmit light emitted from the LED 300 disposed adjacent to the pixel-defining layer 400 to a region spaced apart from the LED 300.

In such an embodiment, a molding portion 528 may be disposed between the LED 300 and the light guider 520. The molding portion 528 may be disposed to surround cover at least the intermediate layer LL of the LED 300, e.g., an exposed portion of the intermediate layer LL shown in FIG. 4.

In such an embodiment, a refractive index of the molding portion 528 may be higher than a refractive index of the light guider 520. An interface between the molding portion 528 and the light guider 520 may be a flat surface, a curved surface, or a mixture of flat and curved surfaces. In such an embodiment, a shape of an interface between the molding portion 528 and the light guider 520, which faces a center of the concave portion based on the LED 300, and a shape of an interface between the molding portion 528 and the light guider 520, which is opposite to the center of the concave portion based on the LED 300, may be different from each other.

In one embodiment, for example, the LED 300 is spaced apart from the center of the concave portion and is disposed adjacent to one side of the pixel-defining layer 400, and the shape of the molding portion 528 located opposite to the center of the concave portion based on the LED 300 may be formed to totally reflect light emitted from the LED 300. In such an embodiment, a shape of the interface between the molding portion 528 and the light guider 520, which is disposed between the LED 300 and the one side of the pixel-defining layer 400 may be formed in a way such that an incident angle of light emitted from the LED 300 and incident on the interface is larger than a threshold angle. Accordingly, light transmitted to the one side of the pixel-defining layer 400 may be induced to face the center of the concave portion by being totally reflected at the interface between the molding portion 528 and the light guider 520.

In such an embodiment, the interface between the molding portion 528 and the light guider 520, which faces the center of the concave portion, does not totally reflect light emitted from the LED 300. Accordingly, a shape of the interface between the molding portion 528 and the light guider 520, which faces the center of the concave portion, may be formed in a way such that an incident angle of light emitted from the LED 300 and incident on the interface is smaller than a threshold angle.

Accordingly, an amount of light towards the pixel-defining layer 400 adjacent to the LED 300 is decreased and an amount of light towards the center of the concave portion is increased, thereby effectively blocking or reducing a phenomenon, such as light escaping, and increasing light extracting efficiency.

In such an embodiment, a shape of the molding portion 528 may be variously modified based on sizes of refractive indexes of the molding portion 528 and light guider 520, a path of light emitted from the LED 300, and a distance from the LED 300 to the interface between the molding portion 528 and the light guider 520.

Figure 10:
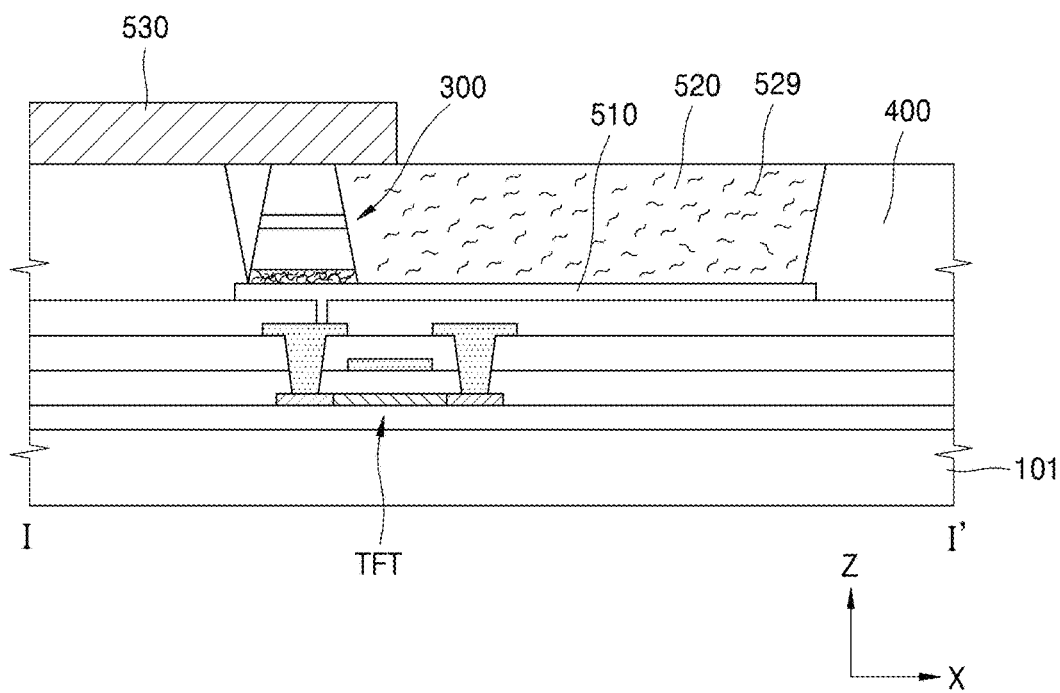

In another alternative embodiment, referring to FIG. 10, the thin-film transistor TFT, the LED 300 electrically connected to the thin-film transistor TFT, and the pixel-defining layer 400 including a concave portion in which the LED 300 is accommodated may be disposed above the substrate 101. The LED 300 may be electrically connected to the first electrode 510 and the light blocker 530, which are disposed opposite to each other based on the LED 300. In such an embodiment, the substrate 101, the thin-film transistor TFT, the LED 300, and the pixel-defining layer 400 are substantially the same as those described above with reference to FIGS. 1 through 4, and any repetitive detailed description thereof will be omitted.

The light guider 520 may be disposed or filled in the concave portion to transmit light emitted from the LED 300 disposed adjacent to the pixel-defining layer 400 to a region spaced apart from the LED 300.

Carbon nano-tubes 529 may be dispersed or distributed in the light guider 520. The carbon nano-tubes 529 have sizes of nano-units, and may be uniformly distributed in the light guider 520. In such an embodiment, the carbon nano-tubes 529 may have a predetermined density determined not to be electrically connected to each other. In such an embodiment, when the number of carbon nano-tubes 529 is too high such that the carbon nano-tubes 529 are connected to each other, an intrinsic color of the carbon nano-tubes 529 is expressed and thus light emitting efficiency of the pixel P of FIG. 1 may deteriorate.

The carbon nano-tubes 529 perform a same function as the scattered particles 522 of FIG. 5 described above. In such an embodiment, the carbon nano-tubes 529 scatter and diffuse-reflect light emitted from the LED 300 to effectively increase discharging of the light.

In such an embodiment, the density of the carbon nano-tube 529 may increase in a region where the first electrode 510 and the LED 300 electrically contact each other.

The LED 300 may be disposed or mounted on the concave portion while the light guider 520, in which the carbon nano-tubes 529 are distributed, is disposed or filled in the concave portion and unhardened, and the carbon nano-tubes 529 may be concentrated between the first electrode 510 and the first contact electrode BE of the LED 300 shown in FIG. 4 to connect the first electrode 510 and the first contact electrode BE in a bridge shape. Accordingly, a contact defect between the first electrode 510 and the first contact electrode BE of the LED 300 may be effectively prevented by using the light guider 520 disposed between the first electrode 510 and the first contact electrode BE of the LED 300. the first electrode 510 and the first contact electrode BE, the density of the carbon nano-tubes 529 in a region where a second electrode (not shown), for example, the light blocker 530, and the second contact electrode TE of the LED 300 shown in FIG. 4 electrically contact each other may be larger than that in other regions of the light guider 520.

In such an embodiment, as shown in FIG. 10, the LED 300 is electrically connected to the first electrode 510 and the light blocker 530, which are disposed opposite to each other based on the LED 300, but an embodiment is not limited thereto. Alternatively, the LED 300 may be connected to the first electrode 510 and the second electrode, which are disposed to face a same side based on the LED 300. In such an embodiment, the light blocker 530 covering the LED 300 may include or be formed of black matrix or the like, and the density of the carbon nano-tubes 529 in the region between the LED 300, and the first electrode 510 and the second electrode may be larger than that in other regions of the light guider 520. In such an embodiment, since the first electrode 510 and the second electrode are spaced apart from each other and the carbon nano-tubes 529 are not concentrated between the first electrode 510 and the second electrode, a short-circuit is not generated between the first electrode 510 and the second electrode.

Figure 11:
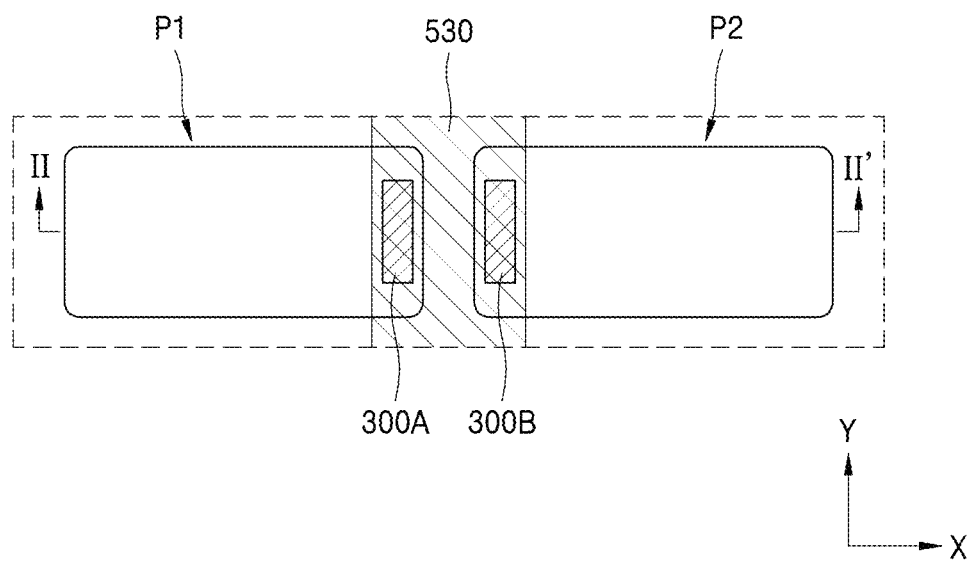
FIG. 11 is a plan view schematically illustrating a pixel structure of an alternative embodiment of the display apparatus of FIG. 1.
Figure 12:
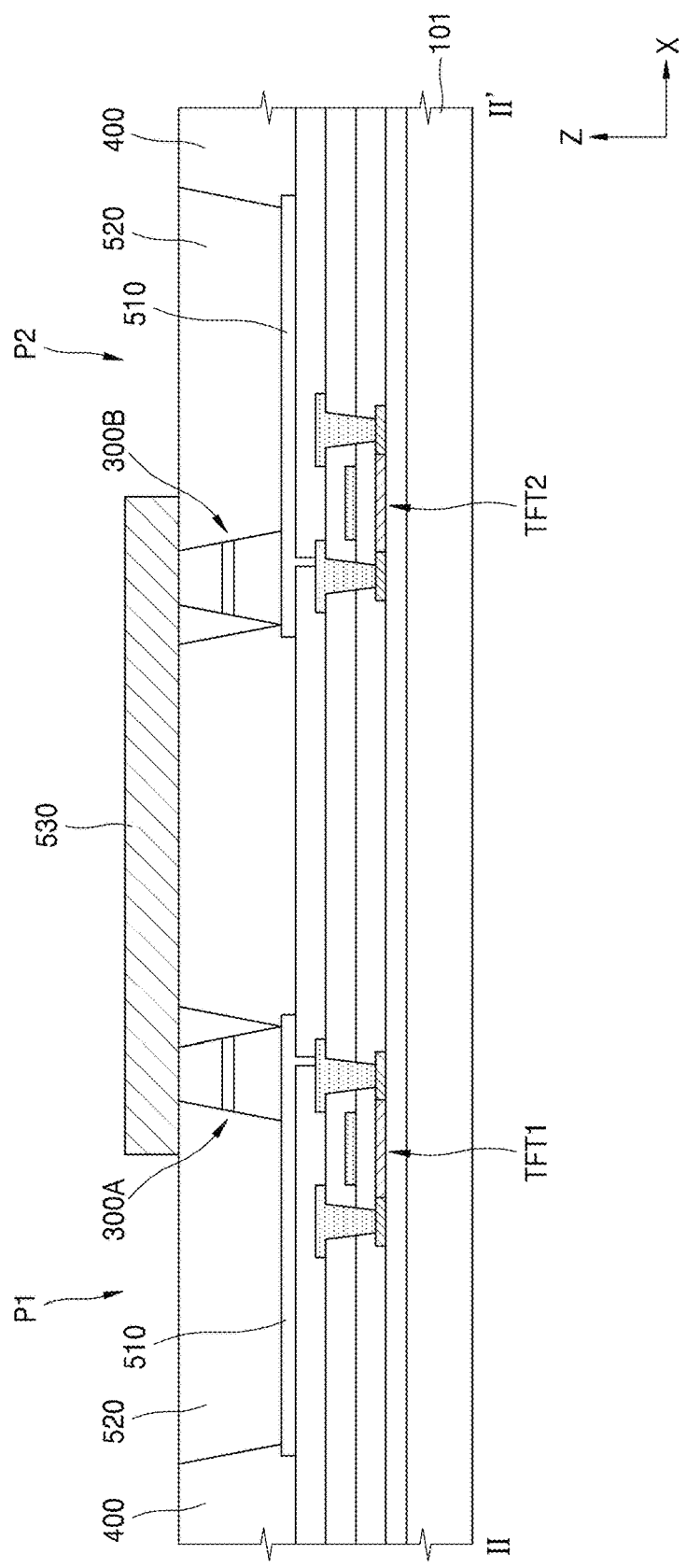
FIG. 12 is a cross-sectional view taken along line II-II' of FIG. 11, according to an embodiment.

FIG. 11 is a plan view schematically illustrating a pixel structure of an alternative embodiment of the display apparatus 100 of FIG. 1, and FIG. 12 is a cross-sectional view taken along line II-II' of FIG. 11.

Referring to FIGS. 11 and 12, in an embodiment, the display apparatus 100 may include two adjacent pixels, i.e., a first pixel P1 and a second pixel P2.

The first pixel P1 may include a first LED 300A disposed above the substrate 101 and a first thin-film transistor TFT1 electrically connected to the first LED 300A, and the second pixel P2 may include a second LED 300B disposed above the substrate 101 and a second thin-film transistor TFT2 electrically connected to the second LED 300B. In such an embodiment, the first and second thin-film transistors TFT1 and TFT2 and the first and second LEDs 300A and 300B are the same as the thin-film transistor TFT and the LED 300 described above with reference to FIGS. 3 and 4, and any repetitive detailed description thereof will be omitted.

In such an embodiment, the first LED 300A and the second Led 300B may be respectively disposed or accommodated in a first concave portion and a second concave portion formed in the pixel-defining layer 400, and the light guider 520 may be disposed or filled in the first and second concave portions.

The first and second LEDs 300A and 300B may be covered by a single light blocker 530.

In such an embodiment, the first and second LEDs 300A and 300B are disposed adjacent to the pixel-defining layer 400 located between the first and second concave portions, and the light blocker 530 may be provided above a top surface of the first LED 300A, a top surface of the second LED 300B, and the pixel-defining layer 400 between the first and second concave portions. Accordingly, processes of forming the light blocker 530 for covering the first LED 300A and the second LED 300B may be simplified, and light may be effectively prevented from leaking between the first LED 300A and the second LED 300B.

In one embodiment, for example, the light blocker 530 may include or be formed of black matrix. In one alternative embodiment, for example, the light blocker 530 may be a second electrode of the display apparatus 100, which is electrically connected to the second contact electrodes TE (shown in FIG. 4) of the first and second LEDs 300A and 300B.

When the light blocker 530 is formed as the second electrode of the display apparatus 100, the first contact electrodes BE of the first and second LEDs 300A and 300B may be electrically connected to the first electrodes 510 that are each patterned.

In such an embodiment, as shown in FIG. 12, the first and second LEDs 300A and 300B are vertical, but an embodiment is not limited thereto. In an alternative embodiment, the first and second LEDs 300A and 300B may be horizontal or flip type light emitting devices in which the first contact electrodes BE and the second contact electrodes TE face the same direction. In such an embodiment, locations of the first electrode 510 and the second electrode may correspond to locations of the first contact electrode BE and the second contact electrode TE, and the light blocker 530 may include or be formed of black matrix or the like.

Figure 13:
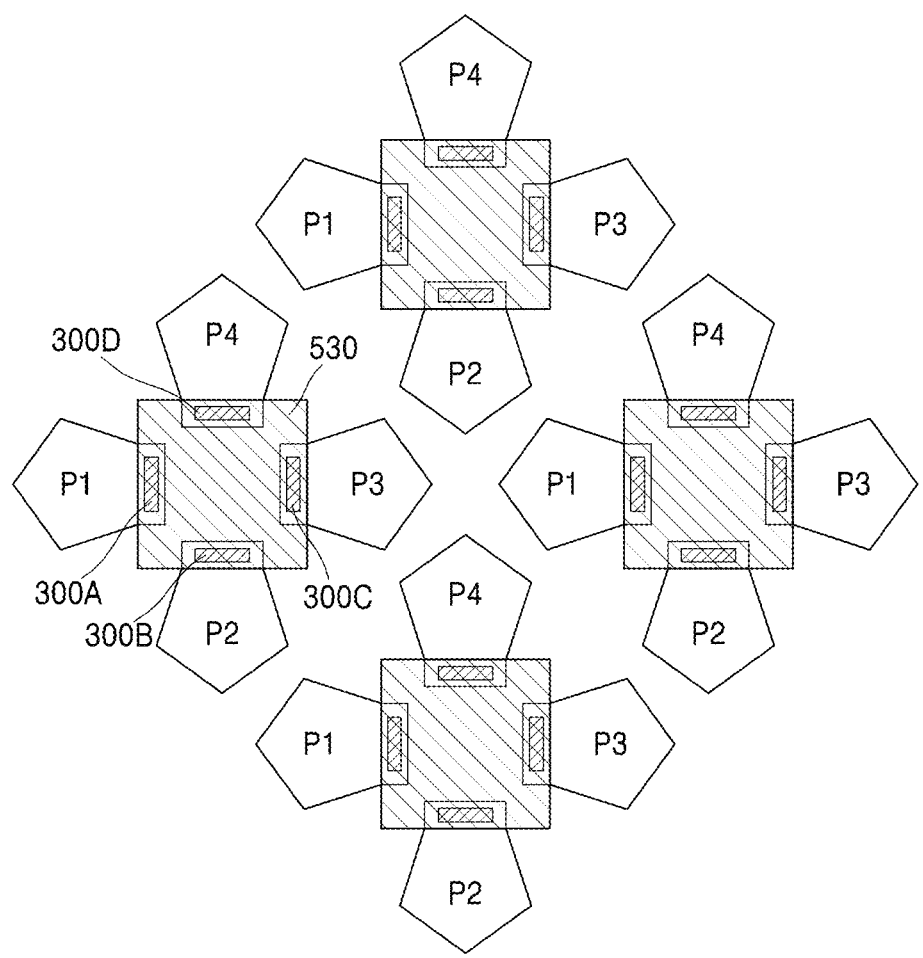
FIG. 13 is a plan view schematically illustrating a pixel structure of the display apparatus, according to an alternative embodiment.

FIG. 13 is a plan view schematically illustrating a pixel structure of the display apparatus 100, according to an alternative embodiment.

Referring to FIG. 13, an embodiment of the display apparatus 100 may include the first pixel P1, the second pixel P2, a third pixel P3, and a fourth pixel P4. In such an embodiment, each of the first through fourth pixels P1 through P4 is substantially the same as the pixel described above with reference to FIGS. 1 through 4. In such an embodiment, the first pixel P is disposed adjacent to the pixel-defining layer 400 while the first LED 300A is disposed in the concave portion formed by the pixel-defining layer 400, and the light guider 520 of FIG. 3 may be filled in the concave portion. The second through fourth pixels P1 through P4 may have the same structure as the first pixel P1.

The first LED 300A, the second LED 300B, a third LED 300C and a fourth LED 300D are disposed adjacent to each other to form a quadrangular shape, and the first through fourth LEDs 300A through 300D may be covered by a single light blocker 530. Accordingly, light may be effectively blocked from being leaked between the first through fourth LEDs 300A through 300D.

In such an embodiment, the first and third pixels P1 and P3 may realize, e.g., display or output, light having a first color, the second pixel P2 may realize light having a second color different from the first color, and the fourth pixel P4 may realize light having a third light different from the first and second colors. The first through fourth pixels P1 through P4 form a unit body, and the unit body may be repeatedly arranged in a particular manner as shown in FIG. 13.

However, an embodiment is not limited thereto, and the first through fourth pixels P1 through P4 may be variously arranged.

In such an embodiment, as shown in FIG. 13, shapes of the first through fourth pixels P1 through P4 are pentagonal shapes, but not being limited thereto. Alternatively, the first through fourth pixels P1 through P4 may have any one of various shapes, such as a quadrangular shape, a circular shape, a conical shape, an oval shape, and a triangular shape, based on a shape of the concave portion in which the light guider 520 is disposed.

In such an embodiment, the light blocker 530 disposed above each of the unit bodies defined by the first through fourth pixels P1 through P4 may be a second electrode of the display apparatus 100, and the unit bodies and the light blocker 530 may be electrically connected to each other.

In such an embodiment, the first through fourth LEDs 300A through 300D may be horizontal or flip type light-emitting devices, and in such an embodiment, the light blocker 530 may be patterned into black matrix or the like.

According to one or more embodiments, an LED is effectively prevented from being recognized as a point source of light and emits light uniformly throughout an emission region, and thus display quality of a display apparatus may increase.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a light-emitting diode disposed above the substrate;
a pixel-defining layer disposed above the substrate and comprising a concave portion which defines a space in which the light-emitting diode is disposed;
a light guider disposed in the space and between the light-emitting diode and a first inner side surface of the concave portion;
a light blocker disposed above the pixel-defining layer to cover a top portion of the light-emitting diode, and
a light blocking layer disposed directly on at least a first side surface of the light-emitting diode, the light blocking layer comprising an insulating material;
wherein the light-emitting diode is disposed adjacent to a second inner side surface of the concave portion, which is opposite to the first inner side surface, and spaced apart from a center of the concave portion,
wherein the light blocker is overlapped with a part of a emission region defined by the pixel defining layer, the light blocker extends to three edges of the pixel defining layer in plain view,
the light guider guides light emitted from the light-emitting diode to a region adjacent to the first inner side surface of the concave portion, and
the first side surface is opposite to a second side surface of the light-emitting diode, the second side surface of the light-emitting diode facing the first inner side surface of the concave portion, the light blocking layer does not cover the second side surface.

2. The display apparatus of claim 1, wherein the light blocking layer extends to cover the top portion of the light-emitting diode.

3. The display apparatus of claim 1, wherein the light blocker extends along a first direction and is disposed above the second inner side surface of the concave portion.

4. The display apparatus of claim 3, further comprising:
a first electrode disposed above the substrate,
wherein the light-emitting diode comprises:
a p-n diode;
a first contact electrode electrically connected to the first electrode; and
a second contact electrode electrically connected to the light blocker.

5. The display apparatus of claim 4, wherein
the light blocker extends along a second direction different from the first direction, and
a voltage for driving the light-emitting diode is applied to the light blocker.

6. The display apparatus of claim 1, wherein a plurality of scattered particles is distributed in the light guider.

7. The display apparatus of claim 6, wherein the scattered particles are more densely distributed in a direction away from the light-emitting diode.

8. The display apparatus of claim 6, wherein the scattered particles comprise a fluorescent substance.

9. The display apparatus of claim 1, wherein
scattered patterns are defined on a surface of the light guider,
wherein the scattered patterns are defined more densely in a direction towards the light blocker.

10. The display apparatus of claim 1, wherein
reflection patterns are disposed in a bottom portion of the concave portion,
wherein the reflection patterns are disposed more densely in a direction away from the light-emitting diode.

11. The display apparatus of claim 10, further comprising:
a first electrode electrically connected to the light-emitting diode and disposed below the bottom portion of the concave portion, and
the reflection patterns are disposed above the first electrode.

12. The display apparatus of claim 1, further comprising:
a molding portion disposed between the light-emitting diode and the light guider,
wherein the light-emitting diode comprises an n-type semiconductor layer, a p-type semiconductor layer, and an intermediate layer between the n-type semiconductor layer and the p-type semiconductor layer, and
the molding portion covers at least an exposed portion of the intermediate layer.

13. The display apparatus of claim 12, wherein a refractive index of the molding portion is different from a refractive index of the light guider.

14. The display apparatus of claim 1, wherein
the light-emitting diode comprises a first contact electrode electrically connected to a first electrode of the display apparatus, and a second contact electrode electrically connected to a second electrode of the display apparatus, and
a plurality of carbon nano-tubes are distributed in the light guider,
wherein a density of the carbon nano-tubes in a region of the light guider between the first contact electrode and the first electrode or a region between the second contact electrode and the second electrode is higher than a density of the carbon-nano-tubes in remaining regions of the light guider.

15. The display apparatus of claim 1, wherein a reflection layer is disposed to cover an inner side surface of the concave portion.

16. The display apparatus of claim 1, wherein
the concave portion comprises a first concave portion and a second concave portion, which are adjacent to each other,
the light-emitting diode comprises a first light-emitting diode and a second light-emitting diode, which are disposed in the first concave portion and the second concave portion, respectively, and
the light blocker extends to cover a top portion of the first light-emitting diode and a top portion of the second light-emitting diode.

17. The display apparatus of claim 16, wherein the first light-emitting diode and the second light-emitting diode are disposed adjacent to a portion of the pixel-defining layer between the first concave portion and the second concave portion.

18. The display apparatus of claim 17, wherein the light blocker is disposed to cover the top portion of the first light-emitting diode, the top portion of the second light-emitting diode, and the portion of the pixel-defining layer between the first concave portion and the second concave portion.

19. A display apparatus comprising:
a substrate;
a light-emitting diode disposed above the substrate;
a pixel-defining layer disposed above the substrate and comprising a concave portion which defines a space for accommodating the light-emitting diode; and
a light blocker disposed to cover a top surface of the light-emitting diode,
wherein the light-emitting diode is spaced apart from a center of the concave portion and disposed adjacent to an inner surface of the pixel-defining layer which defines the concave portion, and
the light-emitting diode comprises: a first side surface, which faces the inner surface of the pixel-defining layer which defines the concave portion; and a second side surface, which is opposite to the first side surface,
wherein a light blocking layer comprising an insulating material is disposed directly on at least the first side surface of the light-emitting diode, and the light blocking layer does not cover the second side surface, and
wherein the light blocker is overlapped with a part of a emission region defined by the pixel defining layer, the light blocker extends to three edges of the pixel defining layer in plain view.

* * * * *